(12) United States Patent
Ryou et al.

(10) Patent No.: US 7,075,962 B2
(45) Date of Patent: Jul. 11, 2006

(54) VCSEL HAVING THERMAL MANAGEMENT

(75) Inventors: Jae-Hyun Ryou, Maple Grove, MN (US); Michael D. Ringle, New Hope, MN (US); Yue Liu, Plymouth, MN (US)

(73) Assignee: Finisar Corporation, Sunnyvale, CA (US)

( * ) Notice: Subject to any disclaimer, the term of this patent is extended or adjusted under 35 U.S.C. 154(b) by 120 days.

(21) Appl. No.: 10/607,758

(22) Filed: Jun. 27, 2003

(65) Prior Publication Data

US 2004/0264530 A1    Dec. 30, 2004

(51) Int. Cl.
 *H01S 5/00* (2006.01)
(52) U.S. Cl. .................. 372/46.011; 372/45.01
(58) Field of Classification Search ............... 372/46, 372/43, 45, 75, 36, 50
 See application file for complete search history.

(56) References Cited

U.S. PATENT DOCUMENTS

| | | | |
|---|---|---|---|
| 4,317,085 A | 2/1982 | Brunham et al. |
| 4,466,694 A | 8/1984 | MacDonald |
| 4,660,207 A | 4/1987 | Svilans |
| 4,675,058 A | 6/1987 | Plaster |
| 4,784,722 A | 11/1988 | Liau et al. |
| 4,885,592 A | 12/1989 | Kofol et al. |
| 4,901,327 A | 2/1990 | Bradley |
| 4,943,970 A | 7/1990 | Bradley |
| 4,956,844 A | 9/1990 | Goodhue et al. |
| 5,031,187 A | 7/1991 | Orenstein et al. |
| 5,052,016 A | 9/1991 | Mahbobzadeh et al. |
| 5,056,098 A | 10/1991 | Anthony et al. |
| 5,062,115 A | 10/1991 | Thornton |
| 5,068,869 A | 11/1991 | Wang et al. |
| 5,079,774 A | 1/1992 | Mendez et al. |
| 5,115,441 A * | 5/1992 | Kopf et al. .................. 375/45 |
| 5,115,442 A | 5/1992 | Lee et al. |
| 5,117,469 A | 5/1992 | Cheung et al. |
| 5,140,605 A | 8/1992 | Paoli et al. |
| 5,157,537 A | 10/1992 | Rosenblatt et al. |
| 5,158,908 A | 10/1992 | Blonder et al. |
| 5,212,706 A | 5/1993 | Jain |
| 5,216,263 A | 6/1993 | Paoli |
| 5,216,680 A | 6/1993 | Magnusson et al. |
| 5,237,581 A | 8/1993 | Asada et al. |
| 5,245,622 A | 9/1993 | Jewell et al. |
| 5,258,990 A | 11/1993 | Olbright et al. |
| 5,262,360 A | 11/1993 | Holonyak, Jr. et al. |

(Continued)

FOREIGN PATENT DOCUMENTS

DE         4240706 A1     6/1994

(Continued)

OTHER PUBLICATIONS

Banwell et al., "VCSE Laser Transmitters for Parallel Data Links", *IEEE Journal of Quantum Electronics*, vol. 29, No. 2, Feb. 1993, pp. 635-644.

(Continued)

*Primary Examiner*—Minsun Oh Harvey
*Assistant Examiner*—Tuan N. Nguyen
(74) *Attorney, Agent, or Firm*—Workman Nydegger

(57) ABSTRACT

A VCSEL structure having thermal management. The structure may be designed for conveyance of heat from the active layer primarily through one of the mirrors to a material that removes heat externally away from the structure. Thermal management may involve various configurations of heat removal for various VCSEL structures. The structures may be designed to effect such respective configurations for heat removal.

22 Claims, 12 Drawing Sheets

U.S. PATENT DOCUMENTS

| | | | |
|---|---|---|---|
| 5,285,466 A | 2/1994 | Tabatabaie |
| 5,293,392 A | 3/1994 | Shieh et al. |
| 5,317,170 A | 5/1994 | Paoli |
| 5,317,587 A | 5/1994 | Ackley et al. |
| 5,325,386 A | 6/1994 | Jewell et al. |
| 5,331,654 A | 7/1994 | Jewell et al. |
| 5,337,074 A | 8/1994 | Thornton |
| 5,337,183 A | 8/1994 | Rosenblatt et al. |
| 5,349,599 A | 9/1994 | Larkins |
| 5,351,256 A | 9/1994 | Schneider et al. |
| 5,359,447 A | 10/1994 | Hahn et al. |
| 5,359,618 A | 10/1994 | Lebby et al. |
| 5,363,397 A | 11/1994 | Collins et al. |
| 5,373,520 A | 12/1994 | Shoji et al. |
| 5,373,522 A | 12/1994 | Holonyak, Jr. et al. |
| 5,376,580 A | 12/1994 | Kish et al. |
| 5,386,426 A | 1/1995 | Stephens |
| 5,390,209 A | 2/1995 | Vakhshoori |
| 5,396,508 A | 3/1995 | Bour et al. |
| 5,404,373 A | 4/1995 | Cheng |
| 5,412,678 A | 5/1995 | Treat et al. |
| 5,412,680 A | 5/1995 | Swirhun et al. |
| 5,416,044 A | 5/1995 | Chino et al. |
| 5,428,634 A | 6/1995 | Bryan et al. |
| 5,438,584 A | 8/1995 | Paoli et al. |
| 5,446,754 A | 8/1995 | Jewell et al. |
| 5,465,263 A | 11/1995 | Bour et al. |
| 5,475,701 A | 12/1995 | Hibbs-Brenner |
| 5,493,577 A * | 2/1996 | Choquette et al. ............ 372/46 |
| 5,497,390 A | 3/1996 | Tanaka et al. |
| 5,513,202 A | 4/1996 | Kobayashi et al. |
| 5,530,715 A | 6/1996 | Shieh et al. |
| 5,555,255 A | 9/1996 | Kock et al. |
| 5,557,626 A | 9/1996 | Grodinski et al. |
| 5,561,683 A | 10/1996 | Kwon |
| 5,567,980 A | 10/1996 | Holonyak, Jr. et al. |
| 5,568,498 A | 10/1996 | Nilsson |
| 5,568,499 A | 10/1996 | Lear |
| 5,574,738 A | 11/1996 | Morgan |
| 5,581,571 A | 12/1996 | Holonyak, Jr. et al. |
| 5,586,131 A | 12/1996 | Ono et al. |
| 5,590,145 A | 12/1996 | Nitta |
| 5,598,300 A | 1/1997 | Magnusson et al. |
| 5,606,572 A | 2/1997 | Swirhun et al. |
| 5,625,729 A | 4/1997 | Brown |
| 5,642,376 A | 6/1997 | Olbright et al. |
| 5,645,462 A | 7/1997 | Banno et al. |
| 5,646,978 A | 7/1997 | Kem et al. |
| 5,648,978 A | 7/1997 | Sakata |
| 5,679,963 A | 10/1997 | Klem et al. |
| 5,692,083 A | 11/1997 | Bennett |
| 5,696,023 A | 12/1997 | Holonyak, Jr. et al. |
| 5,699,373 A | 12/1997 | Uchida et al. |
| 5,712,188 A | 1/1998 | Chu et al. |
| 5,726,805 A | 3/1998 | Kaushik et al. |
| 5,727,013 A | 3/1998 | Botez et al. |
| 5,727,014 A | 3/1998 | Wang et al. |
| 5,774,487 A | 6/1998 | Morgan |
| 5,778,018 A | 7/1998 | Yoshikawa et al. |
| 5,781,575 A | 7/1998 | Nilsson |
| 5,784,399 A | 7/1998 | Sun |
| 5,790,733 A | 8/1998 | Smith et al. |
| 5,805,624 A | 9/1998 | Yang et al. |
| 5,818,066 A | 10/1998 | Duboz |
| 5,828,684 A | 10/1998 | Van de Walle |
| 5,838,705 A | 11/1998 | Shieh et al. |
| 5,838,715 A | 11/1998 | Corzine et al. |
| 5,892,784 A | 4/1999 | Tan et al. |
| 5,892,787 A | 4/1999 | Tan et al. |
| 5,896,408 A | 4/1999 | Corzine et al. |
| 5,901,166 A | 5/1999 | Nitta et al. |
| 5,903,588 A | 5/1999 | Guenter et al. |
| 5,903,589 A | 5/1999 | Jewell |
| 5,903,590 A | 5/1999 | Hadley et al. |
| 5,908,408 A | 6/1999 | McGary et al. |
| 5,936,266 A | 8/1999 | Holonyak, Jr. et al. |
| 5,940,422 A | 8/1999 | Johnson |
| 5,953,362 A | 9/1999 | Pamulapati et al. |
| 5,978,401 A | 11/1999 | Morgan |
| 5,978,408 A | 11/1999 | Thornton |
| 5,995,531 A | 11/1999 | Gaw et al. |
| 6,002,705 A | 12/1999 | Thornton |
| 6,008,675 A | 12/1999 | Handa |
| 6,014,395 A | 1/2000 | Jewell |
| 6,043,104 A | 3/2000 | Uchida et al. |
| 6,046,065 A | 4/2000 | Goldstein et al. |
| 6,052,398 A | 4/2000 | Brillouet et al. |
| 6,055,262 A | 4/2000 | Cox et al. |
| 6,060,743 A | 5/2000 | Sugiyama et al. |
| 6,078,601 A | 6/2000 | Smith |
| 6,086,263 A | 7/2000 | Selli et al. |
| 6,133,590 A | 10/2000 | Ashley et al. |
| 6,144,682 A * | 11/2000 | Sun ............................ 372/45 |
| 6,154,480 A | 11/2000 | Magnusson et al. |
| 6,160,834 A * | 12/2000 | Scott ........................... 372/96 |
| 6,185,241 B1 | 2/2001 | Sun |
| 6,191,890 B1 | 2/2001 | Baets et al. |
| 6,207,973 B1 * | 3/2001 | Sato et al. .................... 257/98 |
| 6,208,681 B1 | 3/2001 | Thorton |
| 6,212,312 B1 | 4/2001 | Grann et al. |
| 6,238,944 B1 | 5/2001 | Floyd |
| 6,269,109 B1 | 7/2001 | Jewell |
| 6,297,068 B1 | 10/2001 | Thornton |
| 6,302,596 B1 | 10/2001 | Cohen et al. |
| 6,339,496 B1 | 1/2002 | Koley et al. |
| 6,369,403 B1 | 4/2002 | Holonyak, Jr. |
| 6,372,533 B1 | 4/2002 | Jayaraman et al. |
| 6,392,257 B1 | 5/2002 | Ramdani et al. |
| 6,410,941 B1 | 6/2002 | Taylor et al. |
| 6,411,638 B1 | 6/2002 | Johnson et al. |
| 6,427,066 B1 | 7/2002 | Grube |
| 6,455,879 B1 | 9/2002 | Ashley et al. |
| 6,459,709 B1 | 10/2002 | Lo et al. |
| 6,459,713 B1 | 10/2002 | Jewell |
| 6,462,360 B1 | 10/2002 | Higgins, Jr. et al. |
| 6,472,694 B1 | 10/2002 | Wilson et al. |
| 6,477,285 B1 | 11/2002 | Shanley |
| 6,487,230 B1 | 11/2002 | Boucart et al. |
| 6,487,231 B1 | 11/2002 | Boucart et al. |
| 6,490,311 B1 | 12/2002 | Boucart et al. |
| 6,493,366 B1 * | 12/2002 | Johnson et al. ............... 372/45 |
| 6,493,371 B1 | 12/2002 | Boucart et al. |
| 6,493,372 B1 | 12/2002 | Boucart et al. |
| 6,493,373 B1 | 12/2002 | Boucart et al. |
| 6,496,621 B1 | 12/2002 | Kathman et al. |
| 6,498,358 B1 | 12/2002 | Lach et al. |
| 6,501,973 B1 | 12/2002 | Foley et al. |
| 6,515,308 B1 | 2/2003 | Kneissl et al. |
| 6,535,541 B1 | 3/2003 | Boucart et al. |
| 6,536,959 B1 | 3/2003 | Kuhn et al. |
| 6,542,531 B1 | 4/2003 | Sirbu et al. |
| 6,567,435 B1 | 5/2003 | Scott et al. |
| 6,845,118 B1 * | 1/2005 | Scott ........................... 372/96 |
| 2001/0004414 A1 | 6/2001 | Kuhn et al. |
| 2001/0006528 A1 * | 7/2001 | Sato et al. .................... 372/46 |
| 2002/0154675 A1 | 10/2002 | Deng et al. |
| 2003/0072526 A1 | 4/2003 | Kathman et al. |

FOREIGN PATENT DOCUMENTS

| | | |
|---|---|---|
| EP | 0288184 A2 | 10/1988 |
| EP | 0776076 A1 | 5/1997 |
| JP | 60123084 | 1/1985 |
| JP | 02054981 | 2/1990 |

| | | |
|---|---|---|
| JP | 5299779 | 11/1993 |
| WO | WO 98/57402 | 12/1998 |

OTHER PUBLICATIONS

Bowers et al., "Fused Vertical Cavity Lasers With Oxide Aperture", Final report for MICRO project 96-042, Industrial Sponsor: Hewlett Packard, 4 pages, 1996-97.

Catchmark et al., "High Temperature CW Operation of Vertical Cavity Top Surface-Emitting Lasers", CLEO 1993, p. 138.

Chemla et al., "Nonlinear Optical Properties of Semiconductor Quantum Wells", *Optical Nonlinearities and Instabilities in Semiconductors*, Academic Press, Inc., Copyright 1988, pp. 83-120.

Choe, et al., "Lateral oxidation of AIAs layers at elevated water vapour pressure using a closed-chamber system," Letter to the Editor, Semiconductor Science Technology, 15, pp. L35-L38, Aug. 2000.

Choa et al., "High-Speed Modulation of Vertical-Cavity Surface-Emitting Lasers", *IEEE Photonics Technology Letter*, vol. 3, No. 8, Aug. 1991, pp. 697-699.

Choquette et al., "High Single Mode Operation from Hybrid Ion Implanted/Selectively Oxidized VCSELs", 200 IEEE 17th International Semiconductor Laser Conference, Monterrey, CA pp. 59-60.

Choquette et al., "Lithographically-Defined Gain Apertures Within Selectively Oxidized VCSELs", paper CtuL6, Conference on Lasers and Electro-Optics, San Francisco, California (2000).

Choquette, et al., "VCSELs in information systems: 10Gbps oxide VCSELs for data communication", Optics In Information Systems, vol. 12, No. 1, p. 5, SPIE International Technical Group Newsletter, Apr. 2001.

Chua, et al., "Low-Threshold 1.57- μm SC-SEL's Using Strain-Compensated Quantum Wells and Oxide/Metal Backmirror," IEEE Photonics Technology Letters, vol. 7, No. 5, pp. 444-446, May 1995.

Chua, et al., "Planar Laterally Oxidized Vertical-Cavity Lasers for Low-Threshold High-Density Top-Surface-Emitting Arrays," IEEE Photonics Technology Letters, vol. 9, No. 8, pp. 1060-1062, Aug. 1997.

Cox, J. A., et al., "Guided Mode Grating Resonant Filters for VCSEL Applications", *Proceedings of the SPIE*, The International Society for Optical Engineering, Diffractive and Holographic Deivce Technologies and Applications V, San Jose, California, Jan. 28-29, 1998, vol. 3291, pp. 70-71.

Farrier, Robert G., "Parametric control for wafer fabrication: New CIM techniques for data analysis," Solid State Technology, pp. 99-105, Sep. 1997.

Fushimi, et al., "Degradation Mechanism in Carbon-doped GaAs Minority-carrier Injection Devices," 34th Annual IRPS Proceedings, Dallas, TX., Apr. 29-May 2, 1996, 8 pages.

G. G. Ortiz, et al., "Monolithic Integration of In0.2 GA0.8As Vertical Cavity Surface-Emitting Lasers with Resonance-Enhanced Quantum Well Photodetectors", *Electronics Letters*, vol. 32, No. 13, Jun. 20, 1996, pp. 1205-1207.

G. Shtengel et al., "High-Speed Vertical-Cavity Surface-Emitting Lasers", *Photon. Tech. Lett.*, vol. 5, No. 12, pp. 1359-1361 (Dec. 1993).

Geib, et al., "Comparison of Fabrication Approaches for Selectively Oxidized VCSEL Arrays," Proceedings of SPIE, vol. 3946, pp. 36-40, 2000.

Graf, Rudolph, *Modern Dictionary of Electronics*, 6th ed., Indiana: Howard W. Sams & Company, 1984, p. 694.

Guenter et al., "Reliability of Proton-Implanted VCSELs for Data Communications", Invited paper, *SPIE*, vol. 2683, OE LASE 96; Photonics West: Fabrication, Testing and Reliability of Semiconductor Lasers, (SPIE, Bellingham, WA 1996).

Guenter, et al., "Commercialization of Honeywell's VCSEL technology: further developments," Proceedings of the SPIE, vol. 4286, GSPIE 2000, 14 pages.

Hadley et al., "High-Power Single Mode Operation from Hybrid Ion Implanted/Selectively Oxidized VCSELs", 13th Annual Meeting IEEE Lasers and Electro-Optics Society 2000 Annual Meeting (LEOS 2000), Rio Grande, Puerto Rico, pp. 804-805.

Hawthorne, et al., "Reliability Study of 850 nm VSELS for Data Communications," IEEE, pp. 1-11, May 1996.

Herrick, et al., "Highly reliable oxide VCSELs manufactured at HP/Agilent Technologies," Invited Paper, Proceedings of SPIE vol. 3946, pp. 14-19, 2000.

Hibbs-Brenner et al., "Performance, Uniformity and Yield of 850nm VCSELs Deposited by MOVPE", *IEEE Phot. Tech. Lett.*, vol. 8, No. 1, pp. 7-9, Jan. 1996.

Hideaki Saito, et al., "Controlling polarization of quantum-dot surface-emitting lasers by using structurally anisotropic self-assembled quantum dots," American Institute of Physics, Appl, Phys. Lett. 71 (5), pp. 590-592, Aug. 4, 1997.

Hornak et al., "Low-Termperature (10K-300K) Characterization of MOVPE-Grown Vertical-Cavity Surface-Emitting Lasers", *Photon. Tech. Lett.*, vol. 7, No. 10, pp. 1110-1112, Oct. 1995.

Huffaker et al., "Lasing Characteristics for Low Threshold Microcavity Layers Using Half-Wave Spacer Layers and Lateral Index Confinement", *Appl. Phys. Lett.*, vol. 66, No. 14, pp. 1723-1725, Apr. 3, 1995.

Jewell et al., "Surface Emitting Microlasers for Photonic Switching & Intership Connections", *Optical Engineering*, vol. 29, No. 3, pp. 210-214, Mar. 1990.

Jiang et al., "High-Frequency Polarization Self-Modulation in Vertical Cavity Surface-Emitting Lasers", *Appl. Phys. Letters*, vol. 63, No. 26, Dec. 27, 1993, pp. 2545-2547.

K.L. Lear et al., "Selectively Oxidized Vertical Cavity Surface-Emitting Lasers with 50% Power Conversion Efficiency", *Elec. Lett.*, vol. 31, No. 3 pp. 208-209, Feb. 2, 1995.

Kash, et al., "Recombination in GaAs at the AIAs oxide-GaAs interface," Applied Physics Letters, vol. 67, No. 14, pp. 2022-2024, Oct. 2, 1995.

Kishino et al., "Resonant Cavity-Enhanced (RCE) Photodetectors", *IEEE Journal of Quantum Electronics*, vol. 27, No. 8, pp. 2025-2034.

Koley B., et al., "Dependence of lateral oxidation rate on thickness of AIAs layer of interest as a current aperture in vertical-cavity surface-emitting laser structures", Journal of Applied Physics, vol. 84, No. 1, pp. 600-605, Jul. 1, 1998.

Kuchibhotla et al., "Low-Voltage High Gain Resonant_Cavity Avalanche Photodiode", *IEEE Photonics Technology Letters*, vol. 3, No. 4, pp. 354-356.

Lai et al., "Design of a Tunable GaAs/AlGaAs Multiple-Quantum-Well Resonant Cavity Photodetector", *IEEE Journal of Quantum Electronics*, vol. 30, No. 1, pp. 108-114.

Lee et al., "Top-Surface Emitting GaAs Four-Quantum-Well Lasers Emitting at 0-85 um", *Electronics Letters*, vol. 24, No. 11, May 24, 1990, pp. 710-711.

Lehman et al., "High Frequency Modulation Characteristics of Hybrid Dielectric/AlGaAs Mirror Singlemode VCSELs", *Electronics Letters*, vol. 31, No. 15, Jul. 20, 1995, pp. 1251-1252.

Maeda, et al., "Enhanced Glide of Dislocations in GaAs Single Crystals by Electron Beam Irradiation," Japanese Journal of Applied Physics, vol. 20, No. 3, pp. L165-L168, Mar. 1981.

Magnusson, "Integration of Guided-Mode Resonance Filters and VCSELs", Electro-Optics Research Center, Department of Electrical Engineering, University of Texas at Arlington, May 6, 1997.

Martinsson et al., "Transverse Mode Selection in Large-Area Oxide-Confined Vertical-Cavity Surface-Emitting Lasers Using a Shallow Surface Relief", IEEE Photon. Technol. Lett., 11(12), 1536-1538 (1999).

Miller et al., "Optical Bistability Due to Increasing Absorption", Optics Letters, vol. 9, No. 5, May 1984, pp. 162-164.

Min Soo Park and Byung Tae Ahn, "Polarization control of vertical-cavity surface-emitting lasers by electro-optic birefringence," Applied Physics Letter, vol. 76, No. 7, pp. 813-815, Feb. 14, 2000.

Morgan et al., "200 C, 96-nm Wavelength Range, Continuous-Wave Lasing from Unbonded GaAs MOVPE-Grown Vertical Cavity Surface-Emitting Lasers", IEEE Photonics Technology Letters, vol. 7, No. 5, May 1995, pp. 441-443.

Morgan et al., "High-Power Coherently Coupled 8×8 Vertical Cavity Surface Emitting Laser Array", Appl. Phys Letters, vol. 61, No. 10, Sep. 7, 1992, pp. 1160-1162.

Morgan et al., "Hybrid Dielectric/AlGaAs Mirror Spatially Filtered Vertical Cavity Top-Surface Emitting Laser", Appl. Phys. Letters, vol. 66, No. 10, Mar. 6, 1995, pp. 1157-1159.

Morgan et al., "Novel Hibrid-DBR Single-Mode Controlled GaAs Top-Emitting VCSEL with Record Low Voltage", 2 pages, dated prior to Dec. 29, 2000.

Morgan et al., "One Watt Vertical Cavity Surface Emitting Laser", Electron. Lett., vol. 29, No. 2, pp. 206-207, Jan. 21, 1993.

Morgan et al., "Producible GaAs-based MOVPE-Grown Vertical-Cavity Top-Surface Emitting Lasers with Record Performance", Elec. Lett., vol. 31, No. 6, pp. 462-464, Mar. 16, 1995.

Morgan et al., "Progress and Properties of High-Power Coherent Vertical Cavity Surface Emitting Laser Arrays", SPIE, Vo. 1850, Jan. 1993, pp. 100-108.

Morgan et al., "Progress in Planarized Vertical Cavity Surface Emitting Laser Devices and Arrays", SPIE, vol. 1562, Jul. 1991, pp. 149-159.

Morgan et al., "Spatial-Filtered Vertical-Cavity Top Surface-Emitting Lasers", CLEO, 1993, pp. 138-139.

Morgan et al., "Submilliamp, Low-Resistance, Continuous-Wave, Single-Mode GaAs Planar Vertical-Cavity Surface Emitting Lasers", Honeywell Technology Center, Jun. 6, 1995.

Morgan et al., "Transverse Mode Control of Vertical-Cavity Top-Surface Emitting Lasers", IEEE Photonics Technology Letters, vol. 4, No. 4, Apr. 1993, pp. 374-377.

Morgan et al., "Vertical-cavity surface-emitting laser arrays", Invited Paper, SPIE, vol. 2398, Feb. 6, 1995, pp. 65-93.

Morgan et al., Vertical-cavity surface emitting lasers come of age, Invited paper, SPIE, vol. 2683, 0-8194-2057, Mar. 1996, pp. 18-29.

Morgan, "High-Performance, Producible Vertical Cavity Lasers for Optical Interconnects", High Speed Electronics and Systems, vol. 5, No. 4, Dec. 1994, pp. 65-95.

Naone R.L., et al., "Tapered-apertures for high-efficiency miniature VCSELs", LEOS newsletter, vol. 13, No. 4, pp. 1-5, Aug. 1999.

Nugent et al., "Self-Pulsations in Vertical-Cavity Surface-Emitting Lasers", Electronic Letters, vol. 31, No. 1, Jan. 5, 1995, pp. 43-44.

Oh, T. H. et al., "Single-Mode Operation in Antiguided Vertical-Cavity Surface-Emitting Laser Using a Low-Temperature Grown AlGaAs Dielectric Aperture", IEEE Photon. Technol. Lett, 10(8), 1064-1066 (1998).

Osinski, et al., "Temperature and Thickness Dependence of Steam Oxidation of AIAs in Cylindrical Mesa Structure," IEEE Photonics Technology Letters, vol. 13, No. 7, pp. 687-689, Jul. 2001.

Peck, D. Stewart, Comprehensive Model for Humidity Testing Correlation, IEEE/IRPS, pp. 44-50, 1986.

Ries, et al., "Visible spectrum ($\lambda$=650nm) photopumped (pulsed, 300 K) laser operation of a vertical-cavity AIAs-AIGaAs/InAIP-InGaP quantum well heterostructure utilizing native oxide mirrors," Applied Physics Letters, vol. 67, No. 8, pp. 1107-1109, Aug. 21, 1995.

S.S. Wang and R. Magnusson, "Multilayer Waveguide-Grating Filters", Appl. Opt., vol. 34, No. 14, pp. 2414-2420, 1995.

S.S. Wang and R. Magnusson, "Theory and Applications of Guided-Mode Resonance Filters", Appl. Opt., vol. 32, No. 14. pp. 2606-2613, 1993.

Sah, et al., "Carrier Generation and Recombination in P-N Junctions and P-N Junction Characteristics," Proceedings of the IRE, pp. 1228-1243, Sep., 1957.

Schubert, "Resonant Cavity Light-Emitting Diode", Appl. Phys. Lett., vol. 60, No. 8, pp. 921-923, Feb. 24, 1992.

Shi, et al., "Photoluminescence study of hydrogenated aluminum oxide-semiconductor interface," Applied Physics Letters, vol. 70, No. 10, pp. 1293-1295, Mar. 10, 1997.

Smith, R.E. et al., Polarization-Sensitive Subwavelength Antireflection Surfaces on a Semiconductor for 975 NM, Optics Letters, vol. 21, No. 15, Aug. 1, 1996, pp. 1201-1203.

Spicer, et al., "The Unified Model For Schottky Barrier Formation and MOS Interface States in 3-5 Compounds," Applications of Surface Science, vol. 9, pp. 83-101, 1981.

Suning Tang et al., "Design Limitations of Highly Parallel Free-Space Optical Interconnects Based on Arrays of Vertical Cavity Surface-Emitting Laser Diodes, Microlenses, and Photodetectors", Journal of Lightwave Technology, vol. 12, No. 11, Nov. 1, 1994, pp. 1971-1975.

T. Mukaihara, "Polarization Control of Vertical-cavity Surface-Emitting Lasers by Birefringent Metal/Semiconductor Polarizer Terminating a Distributed Bragg Reflector," Tokyo Institute of Technology, Precision and Intelligence Laboratory, pp. 183-184.

Tao, Andrea, "Wet-Oxidation of Digitally Alloyed AlGaAs," National Nanofabrication Users Network, Research Experience for Undergraduates 2000, 2 pages.

Tautm, et al., Commerialization of Honeywell's VCSEL Technology, Published in Proceedings fo the SPIE, vol. 3946, SPI, 2000, 12 pages.

Tshikazu Mukaihara, et al., "A Novel Birefringent Distributed Bragg Reflector Using a Metal/Dielectric Polarizer for Polarization Control of Surface-Emitting Lasers," Japan J. Appl. Phys. vol. 33, (1994) pp. L227-L229, Part 2, No. 2B, Feb. 15, 1994.

Tu, Li-Wei et al., "Transparent conductive metal-oxide contacts in vertical-injection top-emitting quantum well lasers", Appl. Phys. Lett. 58 (8) Feb. 25, 1991, pp. 790-792.

Wieder, H.H., "Fermi level and surface barrier of $Ga_xIn_{1-x}As$ alloys," Applied Physics Letters, vol. 38, No. 3, pp. 170-171, Feb. 1, 1981.

Wipiejewski, et al., "VCSELs for datacom applications," Invited Paper, Part of the SPIE Conference on Vertical-Cavity Surface-Emitting Lasers III, San Jose, California, SPIE vol. 3627, pp. 14-22, Jan. 1999.

Y. M. Yang et al., "Ultralow Treshold Current Vertical Cavity Surface Emitting Lasers Obtained with Selective Oxidation", *Elect. Lett.*, vol. 31, No. 11, pp. 886-888, May 25, 1995.

Yablonovitch et al., "Photonic Bandgap Structures", *J. Opt. Soc. Am. B.*, vol. 10, No. 2, pp. 283-295, Feb. 1993.

Young et al., "Enhanced Performance of Offset-Gain High Barrier Vertical-Cavity Surface-Emitting Lasers", *IEEE J. Quantum Electron.*, vol. 29, No. 6, pp. 2013-2022, Jun. 1993.

U.S. Appl. No. 09/751,422, filed Dec. 29, 2000, entitled "Resonant Reflector for Use with Optoelectronic Devices".

U.S. Appl. No. 09/751,423, filed Dec. 29, 2000, entitled "Spatially Modulated Reflector for an Optoelectronic Device".

\* cited by examiner

VCSEL HAVING THERMAL MANAGEMENT

BACKGROUND

The invention pertains to laser light sources and particularly to vertical cavity surface emitting lasers. More particularly the invention pertains to long wavelength lasers.

A vertical cavity surface emitting laser (VCSEL) may include a first distributed Bragg reflector (DBR), also referred to as a mirror stack, formed on top of a substrate by semiconductor manufacturing techniques, an active region formed on top of the first mirror stack, and a second mirror stack formed on top of the active region. The VCSEL may be driven by a current forced through the active region, typically achieved by providing a first contact on the reverse side of the substrate and a second contact on top of the second mirror stack. The first contact may instead be on top of the first mirror stack in a coplanar arrangement.

VCSEL mirror stacks are generally formed of multiple pairs of layers often referred to as mirror pairs. The pairs of layers are formed of a material system generally consisting of two materials having different indices of refraction and being easily lattice matched to the other portions of the VCSEL. For example, a GaAs based VCSEL typically uses an AlAs/GaAs or AlAs/AlGaAs material system wherein the different refractive index of each layer of a pair may be, for example, achieved by altering the aluminum content in the layers. In some devices, the number of mirror pairs per stack may range from 20 to 40 to achieve a high percentage of reflectivity, depending on the difference between the refractive indices of the layers. A larger number of pairs may increase the percentage of reflected light.

In many VCSELS, conventional material systems may perform adequately. However, new products are being developed requiring VCSELs to emit light having long wavelengths. VCSELs emitting light having a long wavelength are of great interest in the optical telecommunications industry because of the low fiber dispersion at 1310 nanometers (nm) and the low fiber loss at 1550 nm. For instance, a long wavelength VCSEL may be obtained by using a structure having an InGaAs/InGaAsP active region. When an InGaAs/InGaAsP active region is used, an InP/InGaAsP material system should be used for the mirror stacks in order to achieve a lattice match relative to the InP substrate. The lattice matching between the substrate and the layers should be substantially close to ensure a true single crystal film or layer growth.

In the InP material based system, it is difficult to achieve a suitable monolithic DBR-based mirror structure having a reasonable thickness because of the insignificant difference in the refractive indices in this material system. As a result, many layers, or mirror pairs, are needed in order to achieve a useful reflectivity. Useful reflectivity may be 99.8 percent or greater. Numerous attempts have been made to address the problem of very thick mirror structures. One attempt included a wafer bonding technique in which a DBR mirror is grown on a separate substrate and bonded to the active region. This technique has had only limited success and also the interface defects density in the wafer fusion procedure may cause potential reliability problems. Other approaches to making satisfactory long wavelength VCSELs have been fraught with one problem or another. For instance, lattice matched InP based mirrors used for 1550 nm VCSELs may have a host of problems in growth, processing and optical performance. The low index contrast of InGaAsP and InAlGaAs tends to lead to a requirement of extremely thick (ten microns or thicker) DBRs of 45 or more mirror periods or layer pairs. The AlGaAsSb or AlGaPSb systems associated with an InP substrate may be difficult to grow by MOCVD, and for good contrast, may still require at least 25 mirror pairs to achieve adequate reflectivity for VCSEL operation. Heat dissipation of heat from a VCSEL having very thick top DBR stacks is difficult. This is particularly the case of InP related materials for long wavelength VCSEL operation. For InP based material systems, since index contrasts are relatively small as compared to GaAs based counterparts, the DBR stacks tend to be much thicker to provide reasonable reflectivity. Consequently, large amounts of heat may be contained in the device. The invention provides a solution.

Additionally, for some VCSEL structures, thermal management is of critical importance for laser characteristics, especially for VCSEL structures containing high thermal impedance in InAlGaP or InAlGaAs active/cavity regions. Effective heat extraction from an active/cavity region should to be considered in the design of a VCSEL structure containing such material systems.

SUMMARY

The invention may involve a vertical cavity surface emitting laser having an InP substrate, a first mirror situated on the substrate, an active region situated on the first mirror, a gain guide formed on the active region and a second mirror situated on the gain guide.

To have a low thermal impedance structure, the thickness and the size of interconnect metal are important for effective heat removal. According to a simulation, a thick and large area interconnect metal is beneficial in thermal management. Also, the covering of the aperture with high thermal conduction materials transparent to lasing wavelengths is very important. While heat transfer occurs laterally mostly via top DBR with low thermal conductive covering (such as $SiO_2$), heat can also be transferred effectively via a conductive covering (such as GaP, SiN, AlN, BN, SiC, diamond, and the like). Since the thickness of the top or upper DBR may be smaller than the bottom DBR thickness, it may generate less heat and better convey heat away from the active region. A top layer on the upper DBR may act as an effective thermal bridge (or a shunt path of heat) to a thick interconnect metal. If the structure requires locating such a layer closer to the active region, a hybrid VCSEL structure having two stacks for an upper mirror may be designed. The heat conductor may be connected to the lower stack or part of the top or upper mirror or DBR. On the other hand, the upper part or stack of the top mirror or DBR may have dielectric material pairs having a high thermal conductivity. Then, the heat conductor may be connected to the top of the upper part or stack of the upper or top mirror or DBR of the VCSEL structure.

To recap some features of thermal management, heat removal may be done with the following approaches. The use of thick interconnect metal may be used for effective heat removal. One may use high thermal conductivity covering materials transparent to the lasing wavelength on certain portions of the structure. There may be the use of a hybrid VCSEL structure having a heat removal mechanism located closer to active region. The use of high thermal conductivity dielectric DBR pair material in a hybrid VCSEL may be utilized for heat removal.

DESCRIPTION

Figure 1:
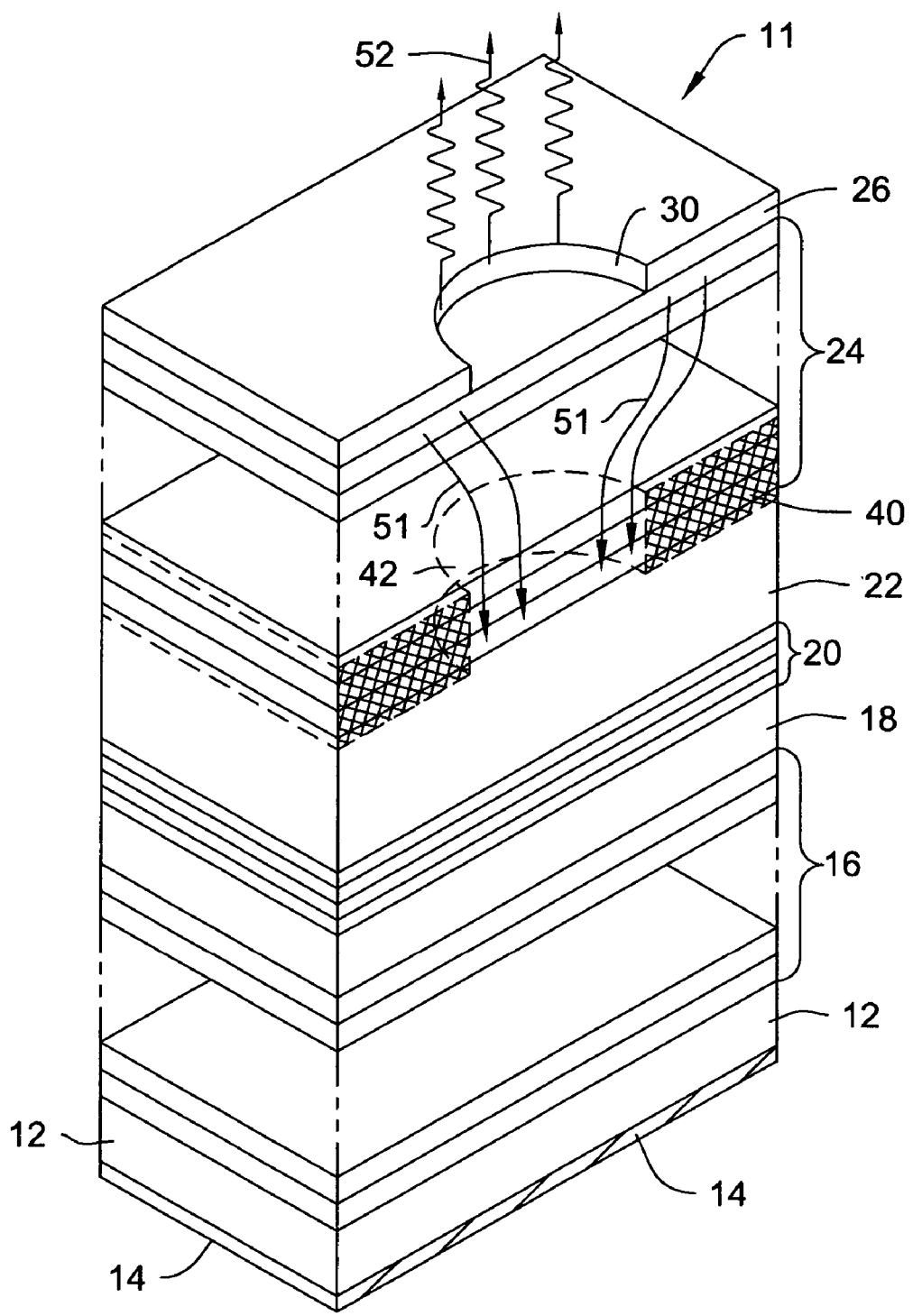
FIG. 1 illustrates a vertical cavity surface emitting laser.

FIG. 1 is a representation showing a perspective illustration of a structure for a vertical cavity surface emitting laser 11. A substrate 12 may be disposed on an electrical contact 14. A first mirror stack 16 and a bottom graded index region 18 may be progressively disposed, in layers, on substrate 12. A quantum well active region 20 may be formed and a top graded index region 22 may be disposed overactive region 20. A top mirror stack 24 may be formed over the active region and a conductivity layer 26 may form an electrical contact. A current 51 may flow from upper contact 26 to lower contact 14. Current 51 may pass through active region 20. Upward arrows in FIG. 1 illustrate the passage of light 52 through an aperture 30 in upper contact 26. The downward arrows illustrate the passage of current 51 downward from upper contact 26 through upper mirror stack 24 and the active region 20. An ion implantation 40 may form an annular region of electrically resistant material. A central opening 42 of electrically conductive material may remain undamaged during the ion implantation process. As a result, current 51 passing from upper contact 26 to lower contact 14 may be forced to flow through conductive opening 42 and thereby be selectively directed to pass through a preselected portion of active region 20. Current 51 may flow through bottom mirror stack 16 and substrate 12 to lower contact 14. Current 51 going through active region 20 may result in a generation of light 52 with in a cavity constituted between top and bottom mirrors 16 and 24. Light 52 may be eventually emitted by structure 11 out of aperture 30 as shown by the upward pointing arrows.

Figure 2:
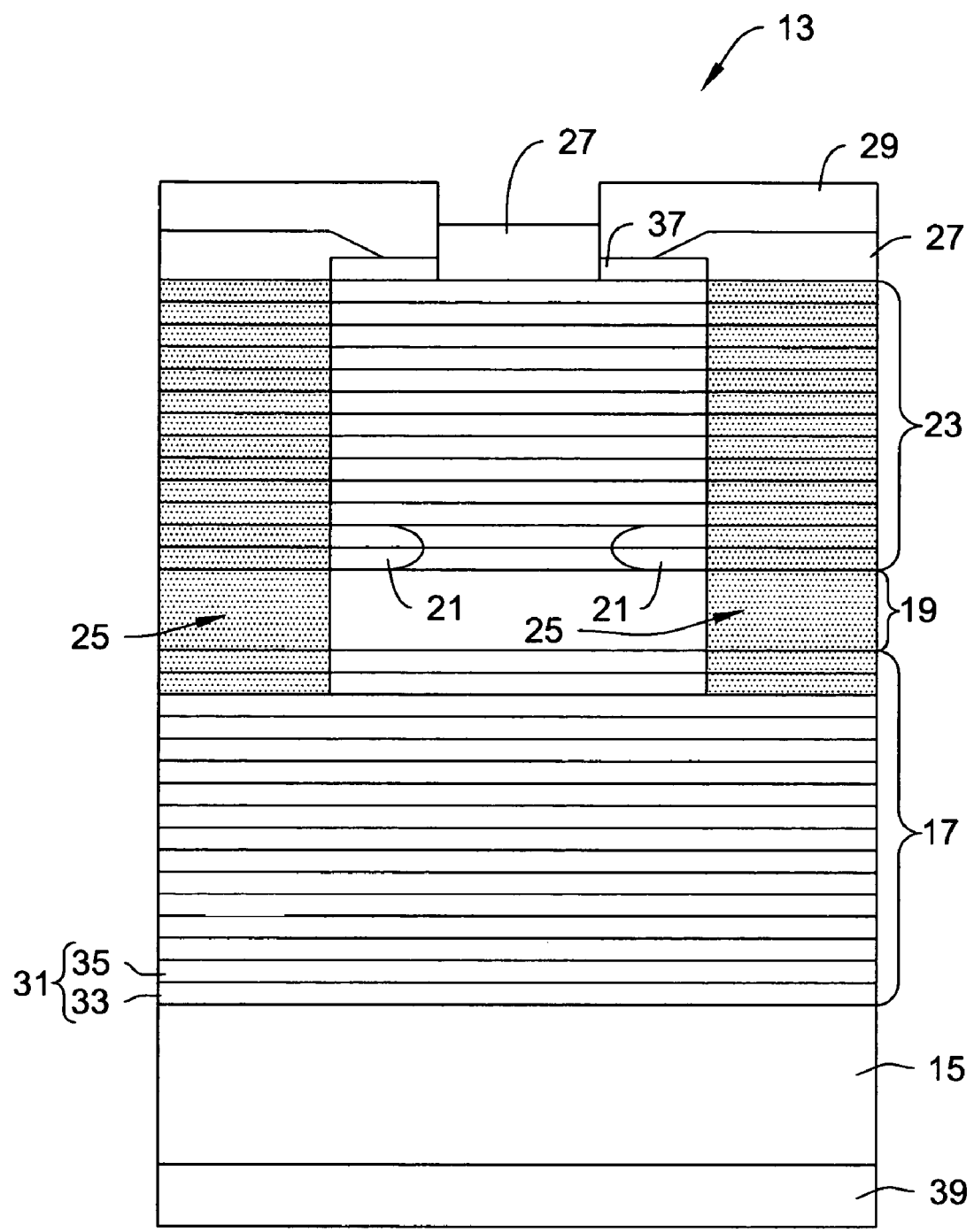
FIG. 2 reveals an illustrative example of a long wavelength InP material based VCSEL.
Figure 3:
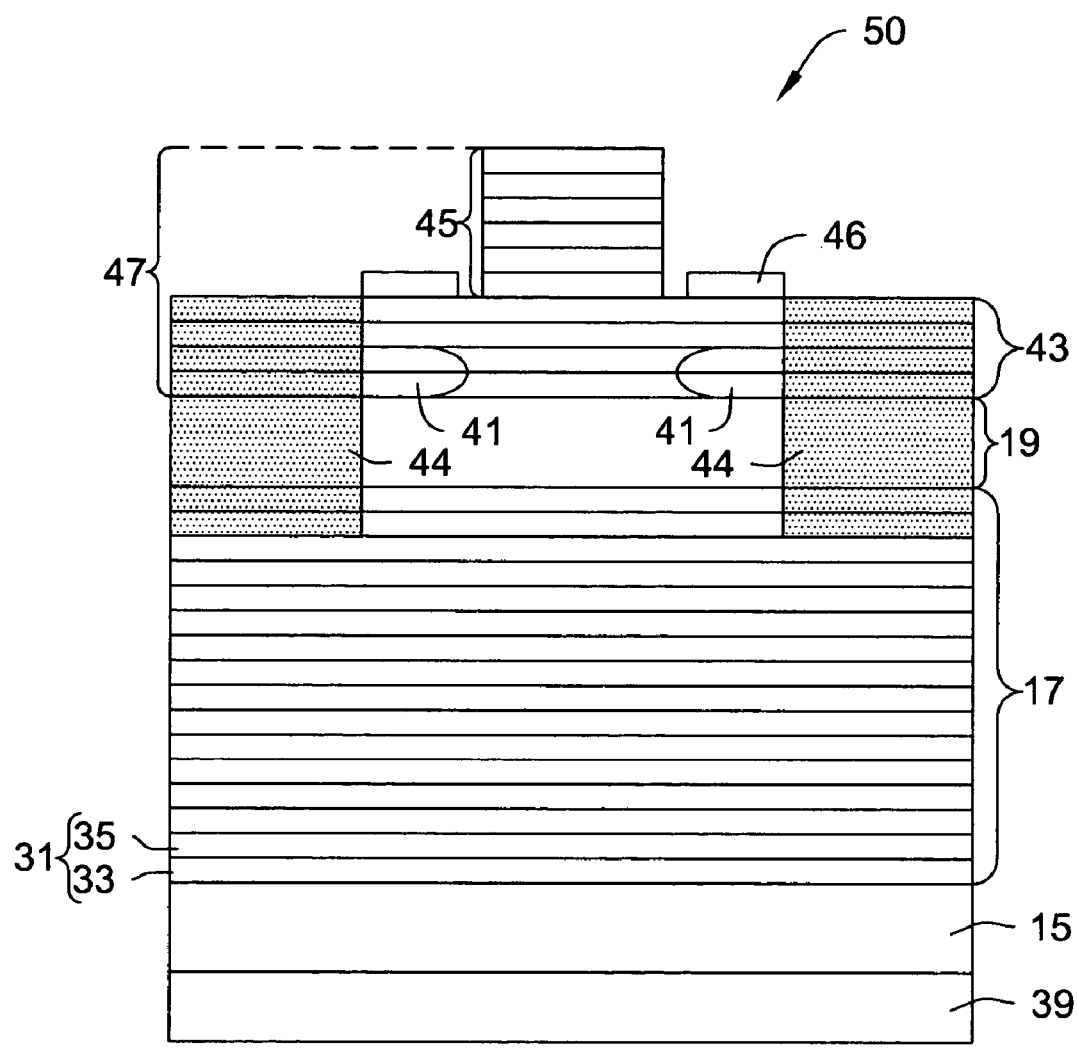
FIG. 3 reveals an illustrative example of a long wavelength VCSEL having a two part top mirror.
Figure 4:
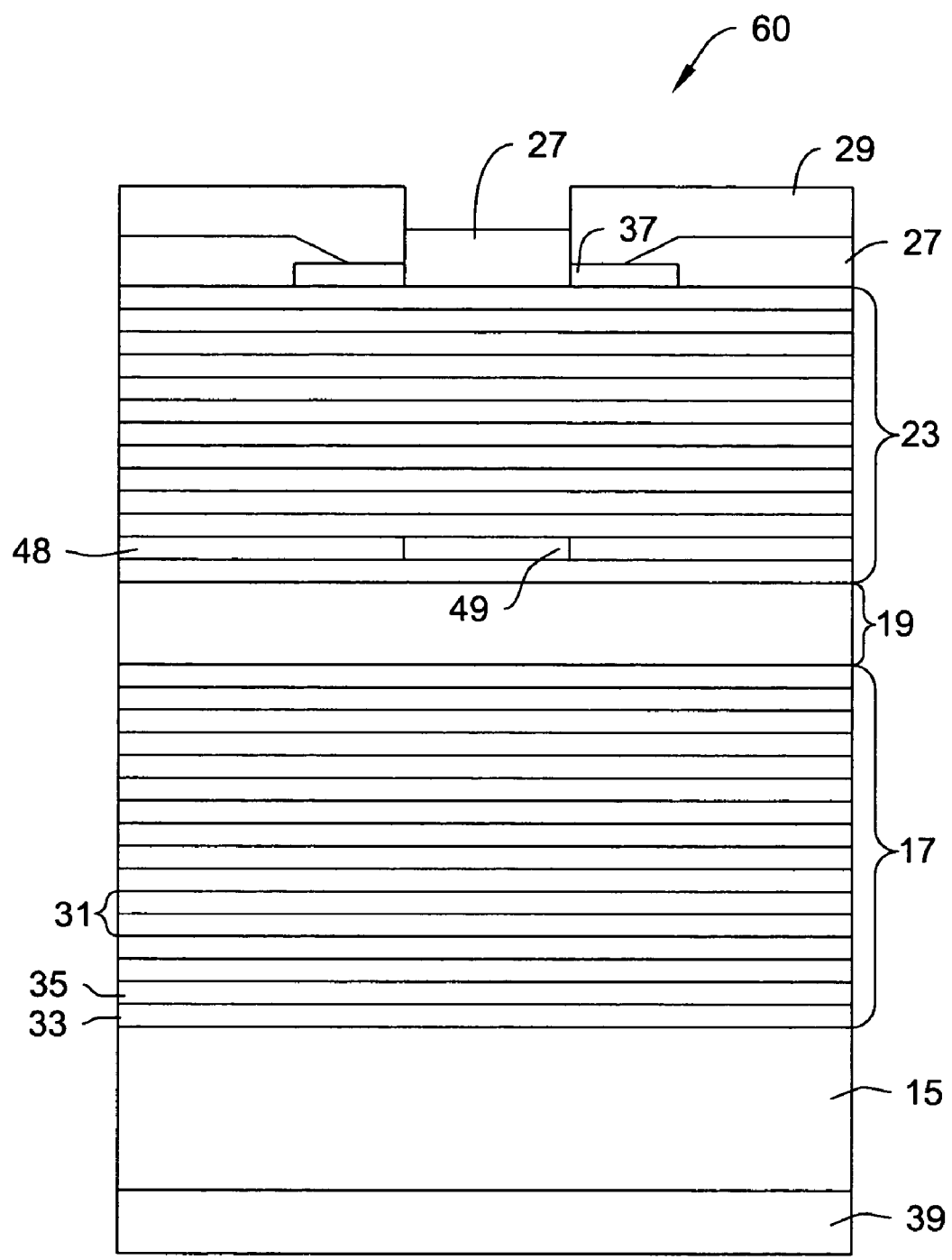
FIG. 4 shows a structure of a VCSEL incorporating an enhanced oxidized layer approach.

FIGS. 2, 3 and 4 reveal several illustrative examples of long wavelength InP based VCSEL structures. A long wavelength may range from about 1200 nm through about 1800 nm. FIGS. 2, 3 and 4 are not necessarily drawn to scale. Structure 13 of FIG. 2 may be a full epitaxial proton implantation version. It may have an InP substrate 15. On substrate may be formed a lower or bottom mirror 17. Mirror 17 may be a distributed Bragg reflector (DBR) having a stack of pairs 31 of layers 33 and 35 of materials. Each pair 31 may be about one-half wavelength thick. Each of the layers 33 and 35 may be about one-fourth wavelength thick. The thicknesses may be optical wavelengths of the light emitted from structure 13, for the respective materials of layers 33 and 35. The two layers, 33 and 35, of each pair 31 may be composed of materials having different indexes of refraction. For example, layer 33 may be InAlGaAs and layer 35 may be InAlAs. These layers and pairs may be repeated in a mirror stack. Other pairs of materials for layers 33 and 35 may include InGaAsP and InP, InAlGaAs and InP, GaAsSb and AlAsSb, and GaAsSb and InP, respectively. There may also be other material pairs that may be appropriate for making DBR mirror 17.

Situated on bottom mirror 17, may be formed an active region or cavity 19. Region 19 may have between one and five quantum wells. On active region 19 may be formed an upper or top mirror 23. DBR mirror 23 may have the same structure of pairs 31 of layers 33 and 35 as that in bottom mirror 17.

Proton implantation may be applied laterally at the lower part of mirror 23 to make a gain guide 21 to provide current guidance and confinement in VCSEL structure 13. A center portion on the top of mirror 23 may be masked with a material resistant to proton implantation. Then a proton implantation may be applied to the top of structure 13 resulting in an isolation 25. Since the indexes of refraction of each material of the pairs of layers are close to each other, then many more pairs 31 may be required to build the mirror with the needed 99.8 percent reflectivity. Consequently, top mirror is a quite thick epitaxial DBR. Thus, rather high energy is required to achieve proton implantation down far enough in mirror 23 to result in an effective isolation 25.

The mask may be removed from the central portion of top mirror 23. Another mask may be applied to the top mirror 23 with an opening for applying a contact metal 37 on the top of mirror 23. Structure 13 may be moved so the resultant contact metal 37 may be in the form of a ring. The mask may be removed after deposition for the contact metal 37. Another mask may be placed on a portion of the contact metal and a passivation layer 27 may be deposited on the top of structure 13. The mask may be removed and another mask may be formed on the center portion of passivation layer 27. A layer of contact metal may be applied on the masked top of structure 13. The mask from the center portion of passivation layer may be removed with the remaining contact metal resulting in a ring-like contact 29 connected to contact metal 37. Contact metal may be deposited on the bottom side of substrate 15 to result in a second contact 39 for VCSEL structure 13.

FIG. 3 shows a VCSEL structure 50 which may a regarded as a hybrid proton implantation version. As like structure 13 of FIG. 2, a mirror 17 may be formed on an InP substrate 15. The structure and materials used in the pairs 31 of layers 33 and 35 may be the same as those in structure 13. An active region on cavity 19, like that of structure 13, may be formed on mirror 17. An active region or cavity 19 may be formed on bottom mirror 17. On cavity 19, a first part 43 of mirror 47 may be formed on active layer or cavity 19. The material of pairs 31 of mirror part 43 may be the same as the pairs of bottom mirror 17 of this structure 50.

Proton implantation may be applied laterally in a lower portion of mirror part 43 to make a gain guide 41 to provide current guidance and confinement in VCSEL structure 50. Mirror part 43 may have fewer pairs 31 of layers 33 and 35 than bottom mirror 17 of this structure 50 or top mirror 23 of structure 13. One reason for the shorter mirror stack 43 may be to effect a proton implantation that results in an isolation 44 requiring much less energy than the proton implantation required for making isolation 25 in structure 13.

On mirror part 43, another mirror part 45 may be formed. Mirror parts 43 and 45 constitute upper DBR mirror 47. Mirror part 45 is a dielectric mirror stack (DBR) 45 that may be like a mesa or an island situated on lower mirror part or portion 43 of upper mirror 47. Mirror stack 45 may have, as examples, 3 to 4 pairs of $TiO_2$ and $SiO_2$, 2 to 3 pairs of Si and $Al_2O_3$, or 4 to 5 pairs of $TiO_2$ and $Al_2O_3$, respectively. The dielectric stack may cover the light aperture of VCSEL structure 50 and not block emitted light.

Formed around dielectric stack 45 may be a ring of contact metal as a first contact 46 for VCSEL structure 50. Contact 46 may be deposited in a manner similar to that of contact 37 for structure 13. A second contact metal may be deposited on the bottom of InP substrate 15 as a second contact 39 for VCSEL structure 50. A disadvantage of structure 50 is the process for making it is complicated by the making of stack 45 and related issues such as, for instance, stress in dielectric DBR stack 45.

FIG. 4 shows VCSEL structure 60 which may be regarded as a full epitaxial oxide version. Lateral oxidation in upper mirror 23 may be resorted to for isolation and current confinement. On InP substrate 15, a lower DBR mirror 17 may be formed. Mirror 17 may have a stack of pairs 31 of layers 33 and 35 having material like that of mirror 17 in structure 13 of FIG. 2. An active region or cavity 19 may be formed on bottom DBR mirror 17. Active region 19 may have one to five quantum wells. The material of active region 19 may include material similar to that of region 19 in structure 13. A top mirror 23 may be formed on active region or cavity 19. Mirror 23 may have a structure of pairs 31 of layers of material like that of mirror 23 in structure 13.

One thing different about structure 60 that is different from structure 13 is that one or two of the layers of a pair 31, near active region 19 in mirror 23, may have a high content of aluminum. In other words, these layers are oxidizable and may be oxidized laterally under certain environmental conditions such as high water vapor and temperature. The result may be lateral oxidation of layer 48 forming a gain guide 49 and providing isolation for VCSEL structure 60. The oxidation of layer 48 may be effected from the edge of mirror 23, via an isolation trench or vertical trenches. Isolation 25 and a gain guide 49 as provided by proton implantation in structure 13 may be absent in structure 60. Contact metal 37 and passivation layer 27 may be formed on the top of upper DBR mirror 23 in the same manner as formed for structure 13. An electrical contact 29, connected to contact metal 37, may be made in the same manner as that for structure 13. Also, contact material may be deposited on the bottom of InP substrate 15 to provide a second electrical contact for VCSEL structure 60.

Figure 5:
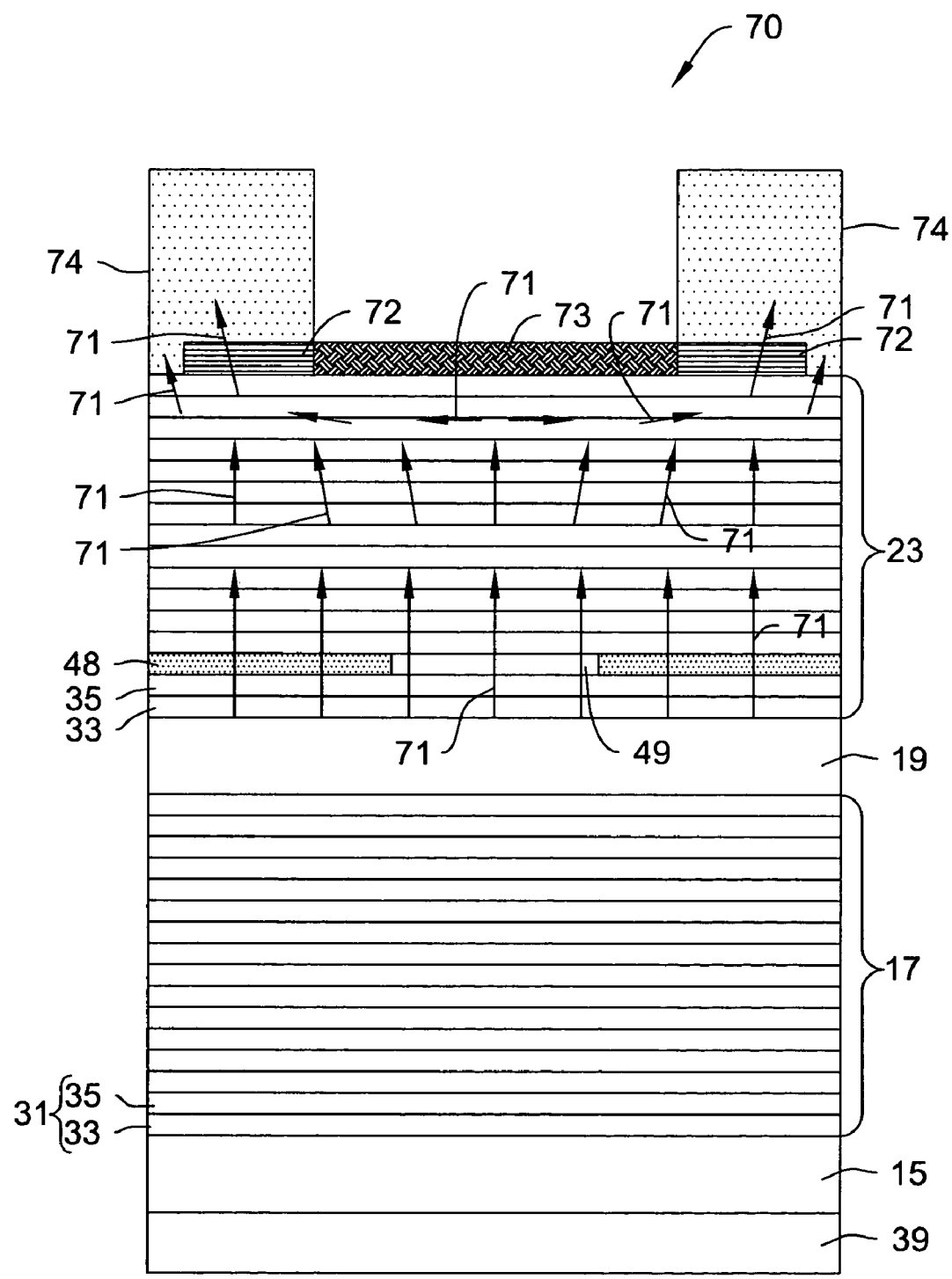
FIG. 5 shows a structure having thermal management of heat through the top mirror into thermally conductive material for conducting heat away from the structure.

FIG. 5 shows thermal management of a VCSEL structure 70. Structure 70 may be similar to structure 60 of FIG. 4 with respect to substrate 15, contact 39, lower mirror 17, active region 19, upper mirror 23, and layer 48 with aperture 49. Heat may be significant from active region 19. Heat 71 and the direction of its movement may be indicated by the arrows, some of which are labeled "71", although all of the arrows are meant to be labeled "71" but might not be so as to maintain an uncluttered figure. These comments may also be applicable to FIGS. 6 through 12. The arrows, however, are not meant to represent the velocity of magnitude of heat 71.

Formed on mirror 23 may be a contact 72 which is thermally conductive. Formed on top of mirror 23 may be a thermally non-conductive layer capping 73. The layers 33 and 35 which alternate through mirror 23, except for layer 48, may be one of the combinations of materials noted above for an InP based system. Layers 33, 35 and 48 may be effectively thermally conductive, depending on the amount of thermal conductivity and depending in part on the material in the respective layers. Heat 71 may emanate from active region 19 having a cavity through mirror 23. Since layer 73 may be effectively non-conductive, heat 71 may move outward as it approaches layer 73. Metal contact 72 (which may be ring-like on the top surface of mirror 23) may be effectively thermally conductive and conduct heat 71. Formed on contact 72 may be a thermally conductive material 74. Material 74 may be gold or other like metal. It may also be a non-metal, thermally conductive material. Heat 71 may flow into contact 72 and material 74. Also, heat 71 may flow from mirror 23 into material 74. Material 74 may be part of a heat sink or interconnect for contact 72. Heat 71 may flow from material 74 to a heat sink, interconnect, or the like external to device structure 70. This scheme of thermal management of structure 70 may be applicable to structure 11, 13 and 60 shown in FIGS. 1, 2 and 4, respectively.

Figure 6:
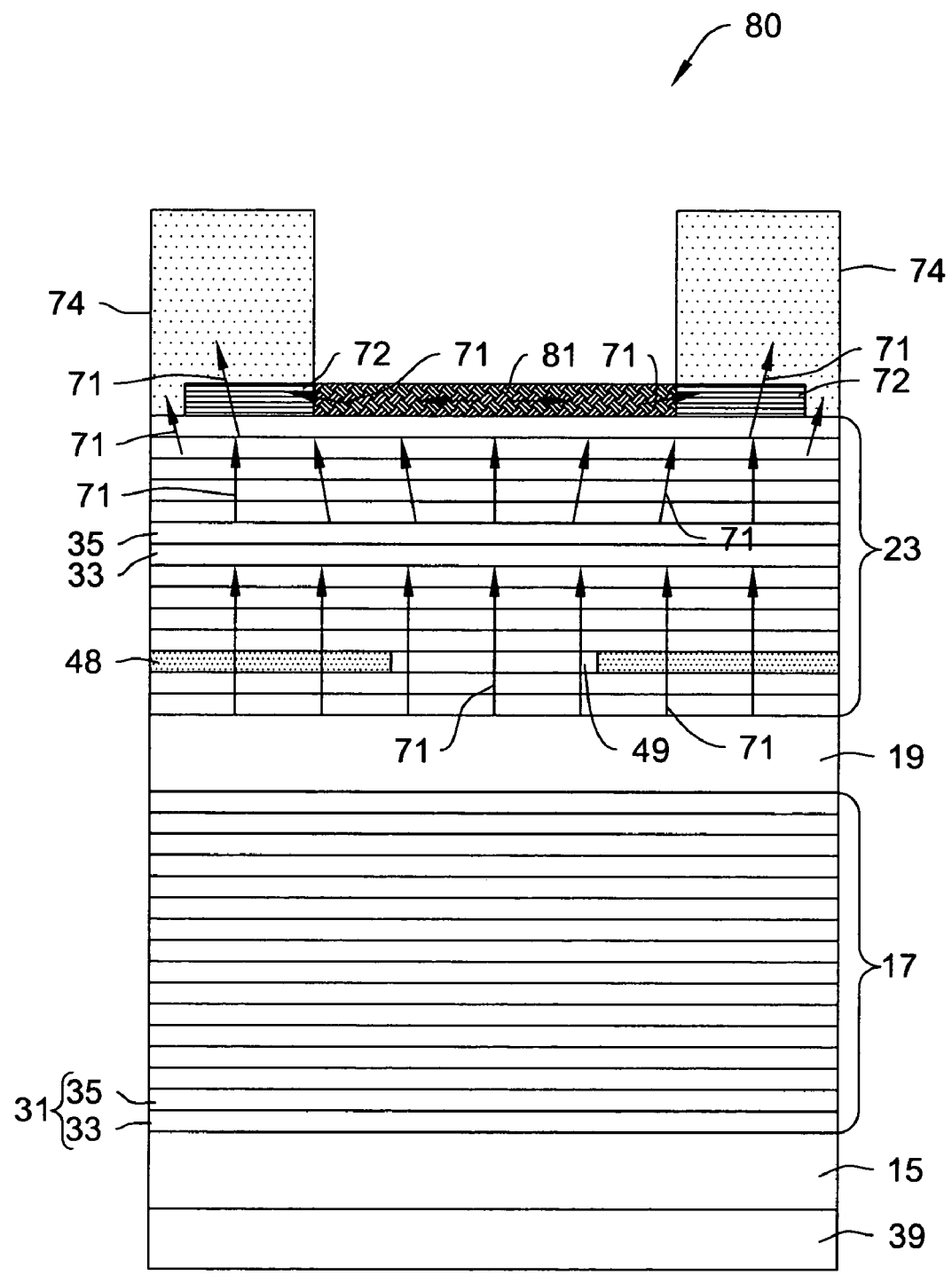
FIG. 6 reveals the structure of FIG. 5 except that the thermally non-conductive layer on the top mirror is replaced with a thermally conductive layer.

FIG. 6 shows thermal management of a VCSEL structure 80. This structure may be similar to structure 70 of FIG. 5 except that layer 73 may be replaced with an effectively thermally conductive capping layer 81. Heat 71 may emanate from active region 19 into and through mirror 23 in a manner similar to that in structure 70. However, heat 71 may go into layer 81 and be conducted outwardly toward and into contact 72. Heat 71 may flow from contact 72 into material 74. Also, heat 71 may flow from mirror 23 into material 74. Heat 71 may flow from material 74 to a heat sink, interconnect, or the like external to device structure 80. This scheme of heat management of structure 80 may be applicable to structures 11, 13 and 60 shown in FIGS. 1, 2 and 4, respectively.

Figure 7:
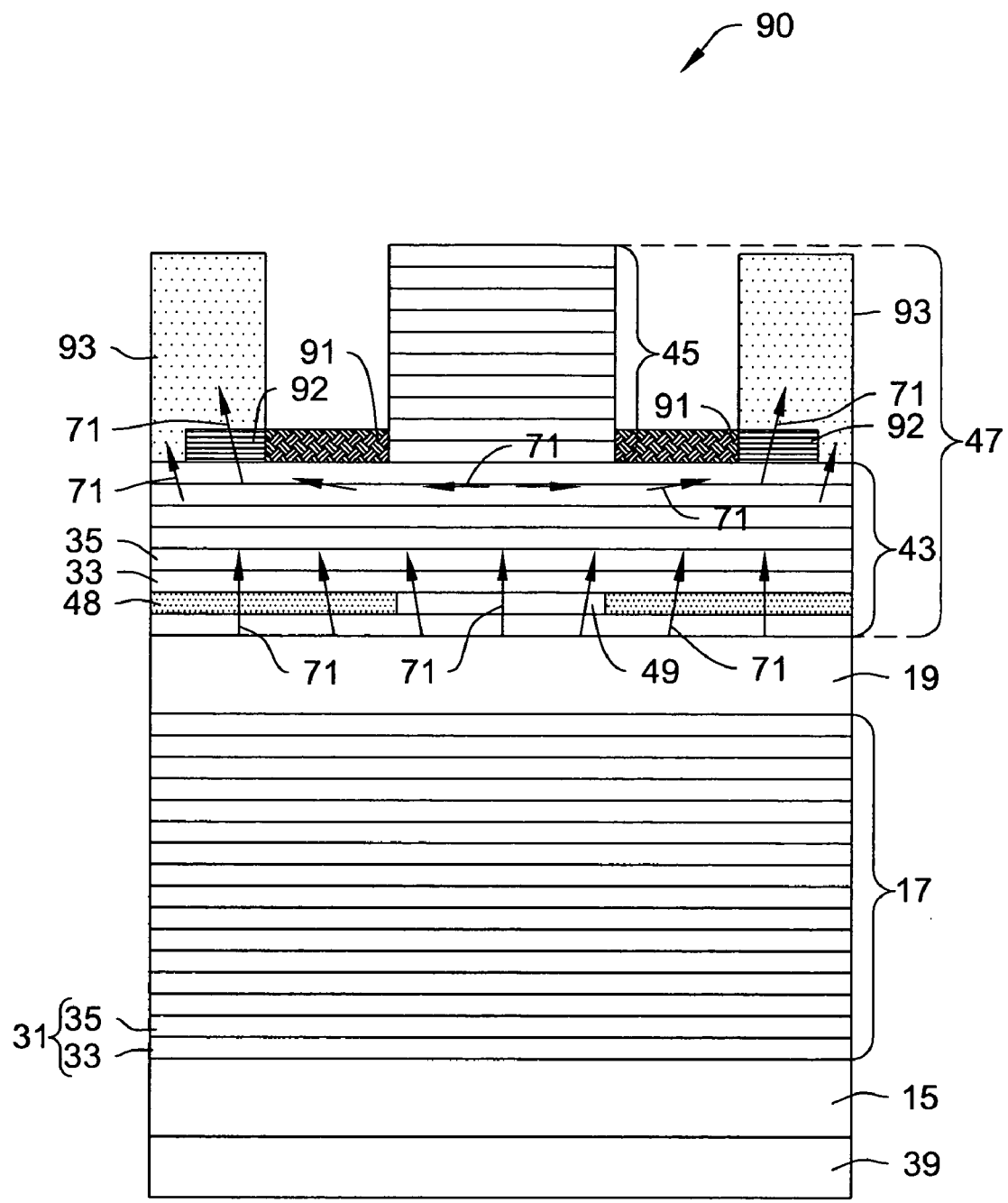
FIG. 7 show a structure with a two part top mirror having a dielectric stack on the lower part of the top mirror, and thermally non-conductive layer between the upper stack and the contact.

FIG. 7 shows a structure 90 having a two-part top mirror 47. Structure 90 may be similar to structure 50 of FIG. 3, except that current confinement and device isolation provided by a laterally oxidized layer 48 with an aperture 49 which may be similar to layer 48 and aperture 49 of structure 60 in FIG. 4. Heat 71 may be generated by active region 19. Heat 71 may be thermally conducted by mirror part 43 of mirror 47 as discussed above relative to mirror 23 in structure 70 of FIG. 5. The flow of heat 71 may be from region 19 through mirror part or stack 43. Layer 91 and dielectric stack 45 may be essentially thermally non-conductive. Thus, heat 71 flows away from the center to effectively thermally conductive electrical contact 92 and material 93. Heat 71 may flow into material 93 from contact 92 and mirror stack 43. Material 93 may be essentially thermally conductive. Material 93 may be gold or other metal. Also, material 93 may be non-metallic. Heat 71 may flow from material 93 to a heat sink, interconnect, or the like external to structure 90. This scheme of thermal management of structure 90 may be applicable to structure 50 of FIG. 3.

Figure 8:
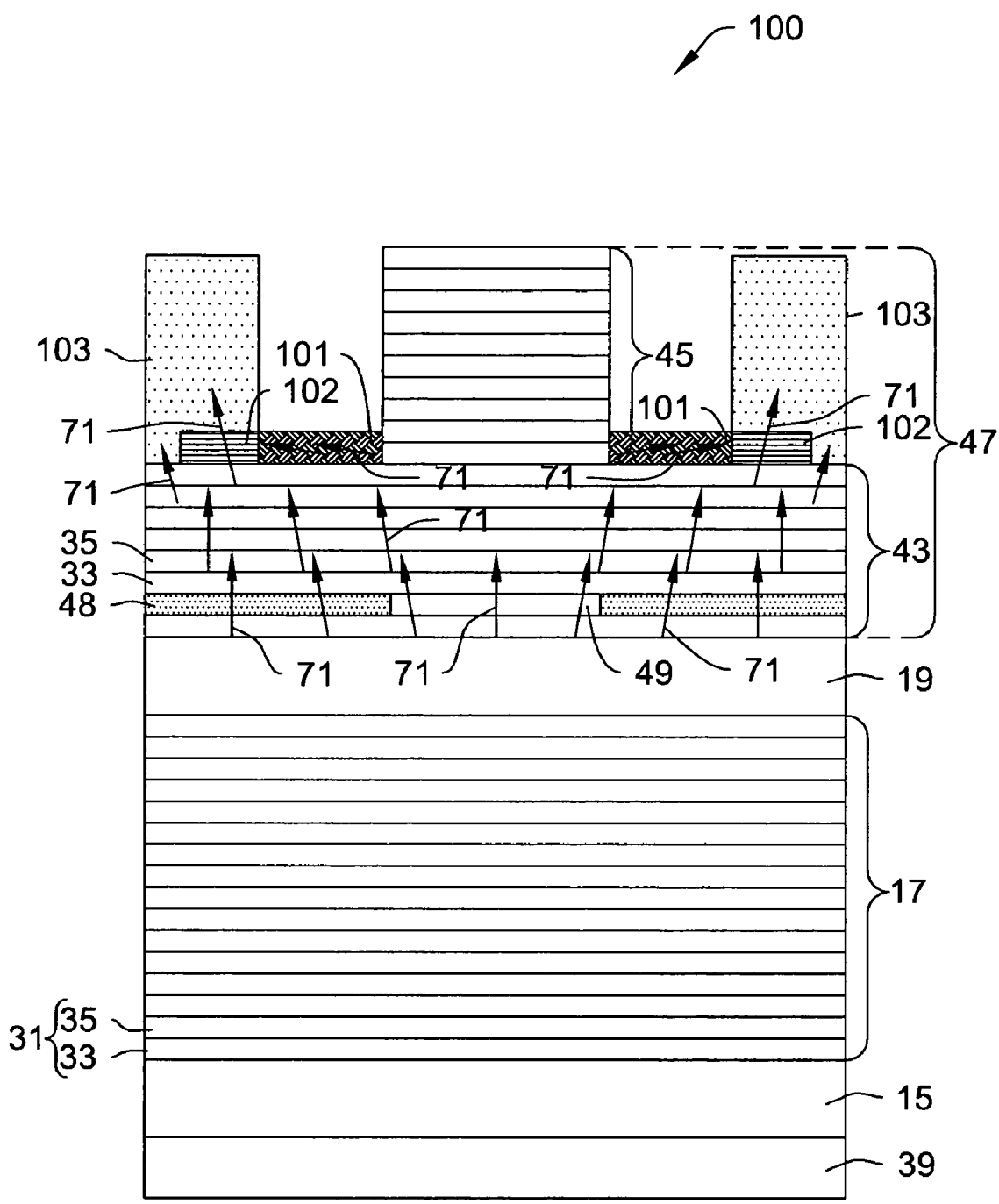
FIG. 8 shows the same structure of FIG. 7 except that the thermally non-conductive layer is replaced by a thermally conductive layer.

FIG. 8 shows a structure 100 that may be similar to structure 90 of FIG. 7, except that structure 100 has an essentially thermally conductive layer 101 in lieu of layer 91 of structure 90. Active region 19 may dissipate heat 71 into stack 43 of top mirror-47. Heat 71 may go through stack 43 into layer 101, contact 102 and effectively thermally conductive material 103. Stack 43 of top mirror 47 may be effectively non-thermally conductive. So heat 71 may move from the center of structure 100 towards and into layer 101.

Heat 71 from layer 101 may flow into contact 102. From contact 102, heat 71 may flow into material 103. Material 103 may be gold or some other metal. Also, material 103 may be non-metallic. Heat 71 may flow from material 103 to a heat sink, interconnect or the like external to structure 100. This scheme of thermal management of structure 100 may be applicable to structure 50 of FIG. 3.

Figure 9:
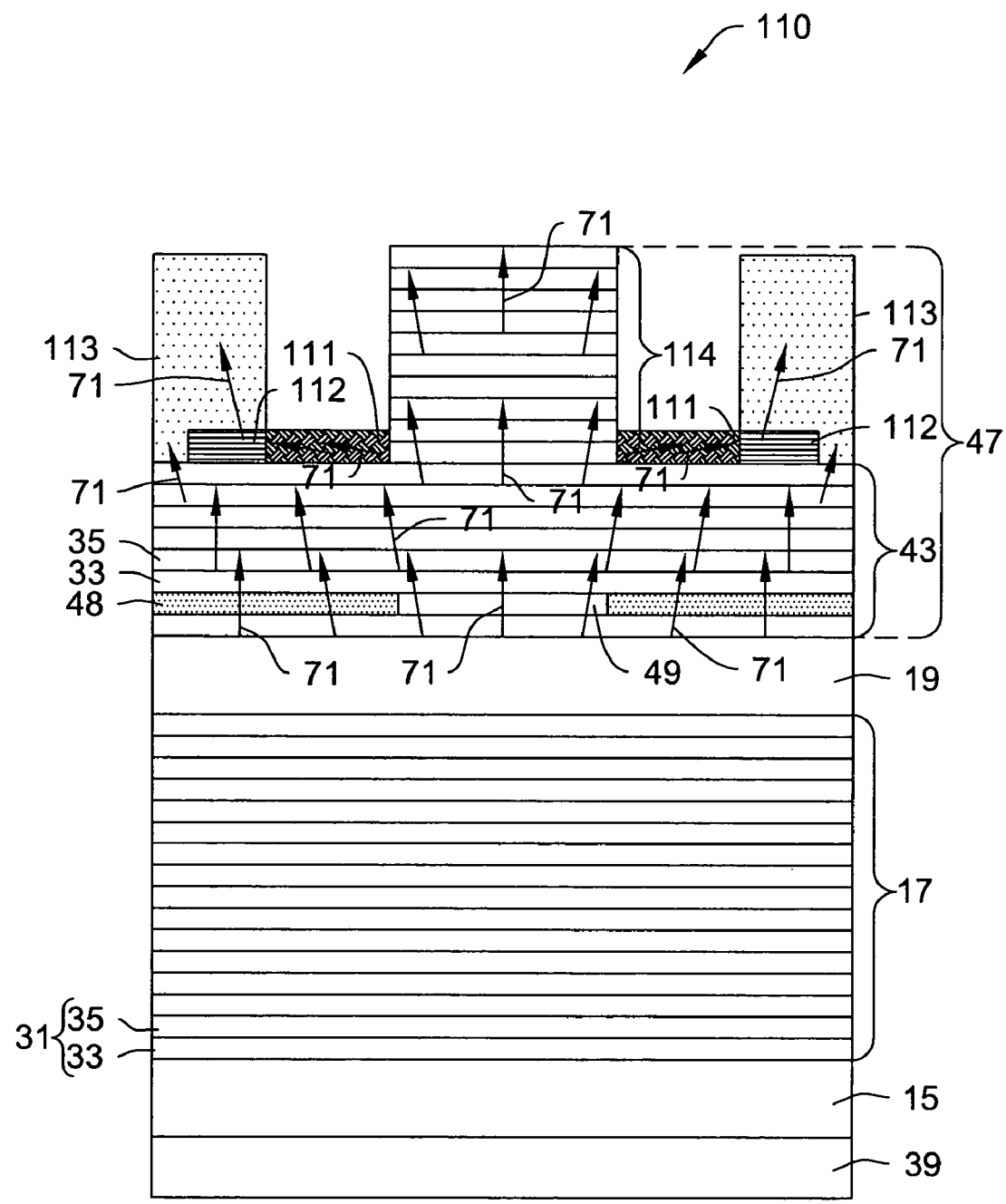
FIG. 9 shows the same structure of FIG. 10 except that the dielectric stack is thermally conductive.

FIG. 9 shows a structure 110 that may be similar to structure 100 of FIG. 8 except for stack 114 of mirror 47, which may be essentially thermally conductive, in contrast to stack 45 of structure 100 in FIG. 8 which may be essentially thermally non-conductive. Heat 71 generated my active region 19 may move through mirror 43. From mirror 43, heat 71 may move into stack 114, effectively thermally conductive layer 111, contact 112 and effectively thermally conductive material 113. Heat 71 from layer 111 may move into contact 112. Heat 71 from contact 112 may move into material 113. Material 113 may be gold or other metal. Alternatively, material 113 may be non-metallic. Heat 71 may flow from material 113 to a heat sink, interconnection, or the like external to structure 110. Heat 71 entering stack 114 may be dissipated into the ambient environment of structure 110.

Figure 10:
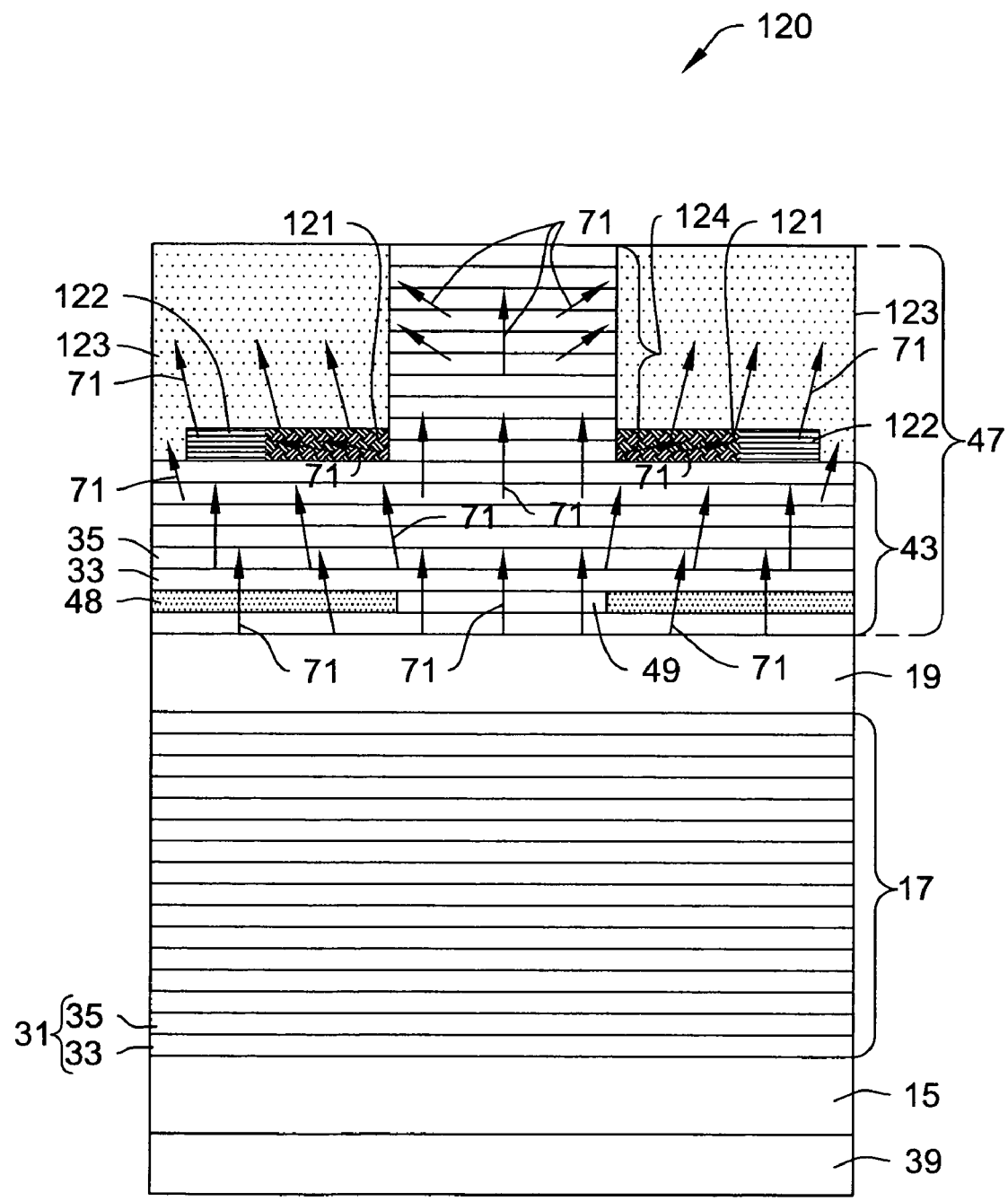
FIG. 10 shows the same structure of FIG. 9 except that the material for conducting the heat away for the structure is extended to be in contact with the dielectric stack.

Material 113 of structure 110 may be replaced with material 123 extending inward to be in contact with the edge of stack 124, as shown in structure 120 of FIG. 10. Heat 71 of stack 124 (same as stack 114) may flow into thermally conductive material 123 which may have the same characteristics as material 113 of structure 110. Thermally conductive layer 121 and contact 122 are like layer 111 and contact 112 of structure 110, respectively. Heat 71 may flow from material 123 to a heat sink, interconnection, or the like. The other heat 71 flows in structure 120 may be similar to those of structure 110 of FIG. 9.

Figure 11:
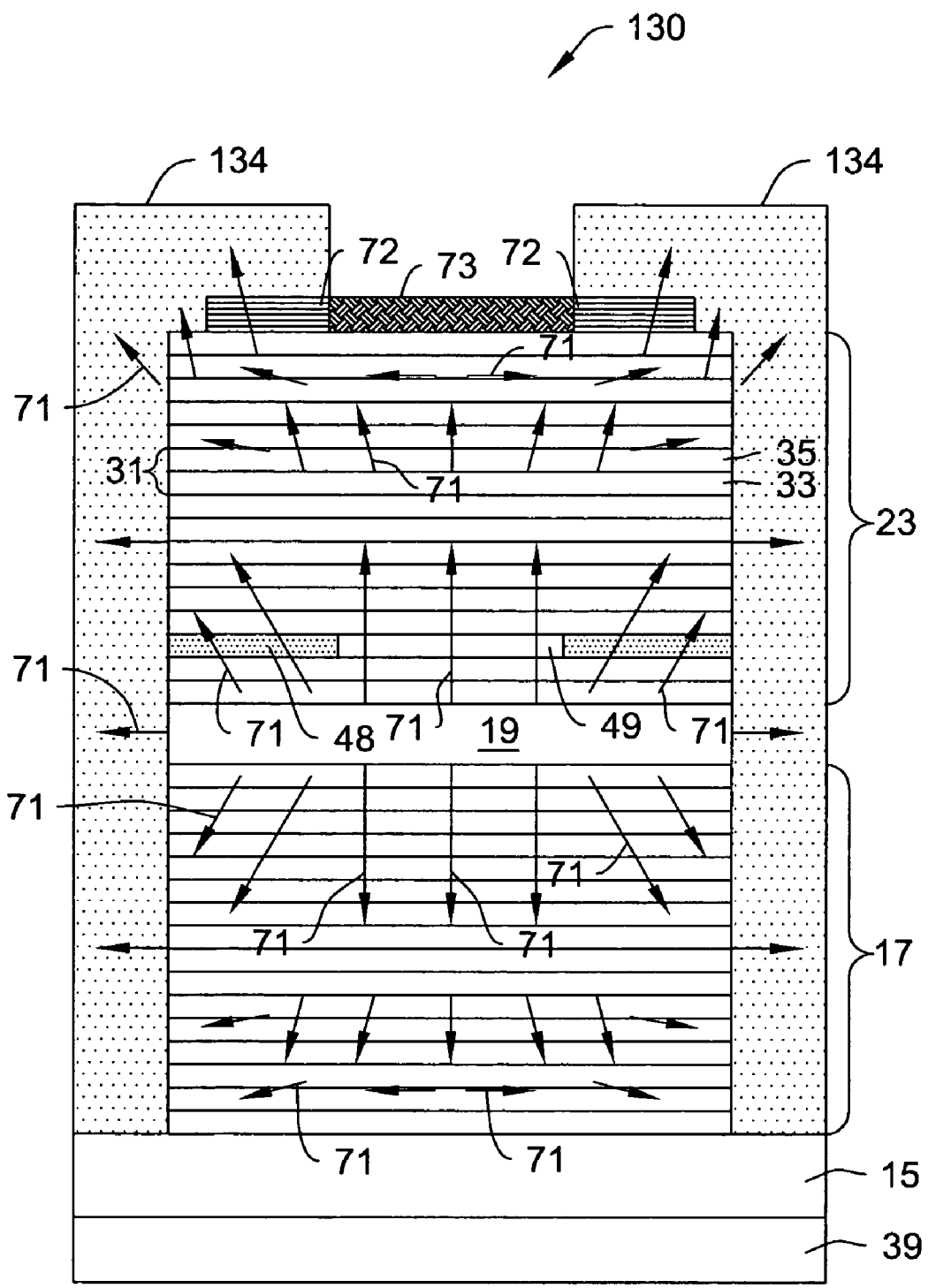
FIG. 11 shows the same structure of FIG. 5 except that the material for conducting heat away from the structure is extended downward to be in contact with the sides of the top and bottom mirrors.
Figure 12:
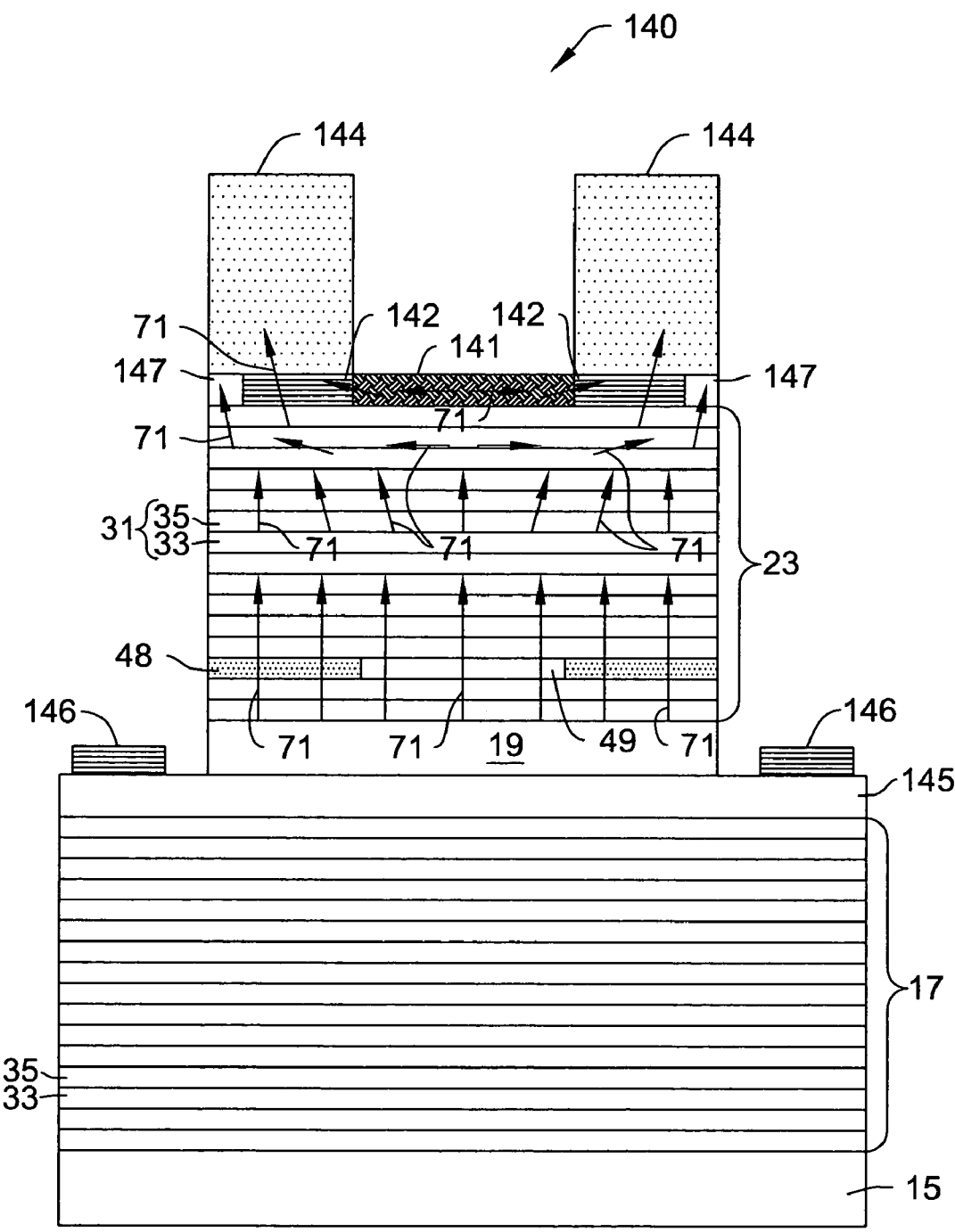
FIG. 12 shows a thermally managed structure having a mesa for the top mirror with a coplanar contact layer on the bottom mirror.

These schemes of thermal management for structures 110 and 120 may be applicable to structure 50 of FIG. 3. FIG. 11 shows a structure 130 having a material 134 which may be put around mirror 23 and possibly mirror 17 for dissipation of heat 71 from active region 19. Structure 130 may be similar to structure 70 if FIG. 5, except for the substitution of material 134 in place of material 74. Capping layer 73 may effectively be non-thermally conductive but can be replaced with a thermally conductive capping layer. Heat 71 may flow from active region 19 into mirrors 17 and 23, and material 134. Mirrors 17 and 23 may utilize pairs 31 of layers 33 and 35 having effectively thermally conducting materials. Heat 71 may flow from mirrors 17 and 23 into contact 72 and material 134. Heat 71 may flow from contact 72 to material 134. Material 134 may be gold or another metal or it may be a non-metallic material.

Thermally conductive or non-conductive passivation material (not shown) may be placed between material 134 and certain portions of mirrors 17 and 23, active region 19, and/or substrate 15. Thermally non-conductive layer 73 may be replaced with a thermally conductive layer to thermally manage heat 71 in another manner. Heat 71 may flow from material 134 to a heat sink, interconnection, or the like. Thick interconnect metal and a highly thermally conductive cap/passivation layer may be located at active region 19 for another scheme of thermal management. The various schemes of thermal management of heat 71 in structure 130 may be applicable to structure 11, 13, 50, 60, 70, 80, 90, 100, 110 and 120 of FIGS. 1 through 10.

The above noted thermal management schemes may be applicable to coplanar, mesa and other types of structures, with various approaches for isolation, and current and optical confinement. Another illustrative example, as in structure 140 of FIG. 12, the various schemes of thermal management noted above may be applicable to a coplanar or mesa structure, where one contact in the mesa structure may be near the top or bottom of bottom mirror 17. Thermal management may be applicable to other variants of the structures disclosed. Structure 140 may have a contact 146 placed on an intra cavity contact layer 145. However, this contact could instead be on the bottom side of substrate 15. Layer 145 may be situated on the top of bottom mirror 17 which in turn is on substrate 15. Another contact 142 may be situated on top mirror 23. Between or in the center of circular contact 142 may be a capping layer 141. Layer 141 may be thermally conductive. However, layer 141 could be substituted with a layer that is effectively thermally non-conductive. Situated on contact 142 may be a thermally conductive material 144. Material 144 could be in contact with mirror 23 adjacent to contact 142. But in FIG. 4 is a passivation layer 147 which may be thermally conductive. Alternatively, layer 147 could be effectively thermally non-conductive. Isolation and/or current confinement (including possible optical confinement) may be provided by partially and laterally oxidized layer 48 with aperture 49. However, isolation and/or current confinement (including possible optical confinement) may be provided by implantation 40, 21, 25, 41, and 44, as shown in FIGS. 1, 2 and 3, respectively. Device 140 isolation may additionally or instead be provided by a trench or other technique.

Heat 71 may emanate from active region 19 and go through top mirror 23 to layer 141, contact 142 and passivation layer 147. Heat 71 may flow from layer 141 to contact 142. Heat 71 from passivation layer 147 and contact 142 may go into material 144. Heat 71 may flow from material 144 to a heat sink, an interconnection, or the like. Material 144 may be applied to the side or edge around the perimeter of mirror 23 for greater heat 71 dissipation. The approach to thermal management of structure 140 may be applicable to the other structures disclosed in the present description.

Although the invention has been described with respect to at least one illustrative embodiment, may variations and modifications will become apparent to those skilled in the art upon reading the present specification. It is therefore the intention that the appended claims be interpreted as broadly as possible in view of the prior art to include all such variations and modifications.

What is claimed is:

1. A vertical cavity surface emitting laser (VCSEL) comprising:
   a substrate;
   a first mirror situated on said substrate;
   an active region situated on said first mirror;
   a second mirror situated on said active region;
   a first contact situated on a first portion of said second mirror;
   a thermally conductive layer situated on a second portion of said second mirror;
   and wherein said thermally conductive layer is thermally connected to said first contact.

2. The VCSEL of claim 1, further comprising a thermally conductive metal connected to said first contact.

3. The VCSEL of claim 2, wherein said substrate comprises InP.

4. The VCSEL of claim 1, further comprising a thermally conductive material connected to said thermally conductive cover.

5. The VCSEL of claim 4, wherein said top mirror comprises InP based material.

6. The VCSEL of claim 5, wherein said top mirror is designed for reflecting some radiation having a wavelength be 1200 and 1800 nanometers (nm).

7. The VCSEL of claim 6, wherein said thermally conductive cover comprises a material from a group of GaP, SiN, AlN, BN, SiC, diamond, and the like.

8. The VCSEL of claim 7, wherein said thermally conductive material comprises a material from a group of gold and like materials.

9. A VCSEL comprising:
a substrate;
a first mirror situated on said substrate;
an active region situated on said first mirror;
a second mirror situated on said active region;
a contact situated on a first portion of said second mirror;
a low thermal conductive covering situated on a second portion of said second mirror; and
a thermally conductive material connected to said contact.

10. The VCSEL of claim 9, wherein said substrate comprises InP.

11. The VCSEL of claim 10, wherein said first mirror comprises a material nearly lattice matched with the InP of said substrate.

12. The VCSEL of claim 11, wherein said thermally conductive material is for conducting heat from said second mirror via said contact.

13. The VCSEL of claim 12, wherein said thermally conductive material comprises material from a group of gold and other like materials.

14. The VCSEL of claim 13, wherein the VCSEL is for emitting a laser light having a wavelength between 1200 nm and 1800 nm.

15. The VCSEL of claim 12, wherein said contact comprises a thermally conductive material.

16. The VCSEL of claim 15, wherein said thermally conductive material is connected to a heat sink.

17. A VCSEL comprising:
a substrate;
a first semiconductor mirror situated on said substrate;
an active region situated on said first semiconductor mirror;
a second semiconductor mirror situated on said active region;
a dielectric mirror situated on said second semiconductor mirror;
a first contact situated on said second semiconductor mirror; and
a metal interconnect connected to said first contact and in contact with an edge of said dielectric mirror; and
wherein said dielectric mirror comprises thermally conductive material.

18. A VCSEL comprising:
a substrate;
a first mirror situated on said substrate;
an active region situated on said first mirror;
a second mirror situated on said active region; and
a thermally conductive material in contact with an edge of said second mirror;
a contact thermally connected to said thermally conductive material and
a thermally conductive layer that is thermally connected to said thermally conductive material and said second mirror.

19. The VCSEL of claim 18, wherein the contact is situated on said second mirror.

20. The VCSEL of claim 19, wherein said thermally conductive layer is situated on said second mirror.

21. The VCSEL of claim 20, further comprising a second thermally conductive material situated on said second mirror and said contact.

22. A vertical cavity surface emitting laser, comprising:
a substrate;
a first mirror situated on said substrate;
an active region situated on said first mirror;
a second mirror situated on said active region;
a contact situated on said second mirror; and
a thermally conductive structure arranged for thermal communication with the first mirror and the second mirror.

* * * * *